(12) United States Patent
Oikawa

(10) Patent No.: US 9,386,703 B2
(45) Date of Patent: Jul. 5, 2016

(54) ELECTRONIC DEVICE

(75) Inventor: Akira Oikawa, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 209 days.

(21) Appl. No.: 14/345,143

(22) PCT Filed: Sep. 13, 2012

(86) PCT No.: PCT/JP2012/073470
§ 371 (c)(1),
(2), (4) Date: Mar. 14, 2014

(87) PCT Pub. No.: WO2013/039149
PCT Pub. Date: Mar. 21, 2013

(65) Prior Publication Data
US 2014/0369013 A1    Dec. 18, 2014

(30) Foreign Application Priority Data
Sep. 15, 2011   (JP) .................................. 2011-201915

(51) Int. Cl.
*H05K 7/00*      (2006.01)
*H05K 1/18*      (2006.01)
*H03H 9/05*      (2006.01)
(Continued)

(52) U.S. Cl.
CPC .............. *H05K 1/185* (2013.01); *H01L 23/315* (2013.01); *H03H 9/059* (2013.01); *H03H 9/1085* (2013.01); *H05K 3/284* (2013.01);
(Continued)

(58) Field of Classification Search
CPC ................. H01L 2224/16225; H01L 23/3121; H01L 23/315; H03H 9/059; H03H 9/1085; H05K 1/0271; H05K 1/185; H05K 2201/10068; H05K 3/284
USPC .......... 361/760, 761, 764, 771; 174/255, 258, 174/260
See application file for complete search history.

(56) References Cited

U.S. PATENT DOCUMENTS 6,329,739 B1    12/2001   Sawano
6,754,950 B2 *   6/2004   Furukawa ............... H01L 21/56
                                                257/E21.502
(Continued)

FOREIGN PATENT DOCUMENTS

JP    2000-004139 A    1/2000
JP    2002-290199 A    10/2002
(Continued)

OTHER PUBLICATIONS

Office Action dated Oct. 17, 2014, issued in counterpart Japanese application No. 2013-533708.
(Continued)

*Primary Examiner* — Yuriy Semenenko
(74) *Attorney, Agent, or Firm* — Procopio, Cory, Hargreaves & Savitch LLP

(57) ABSTRACT

The electronic device is provided with a wiring board, a piezoelectric element (electronic component) which is mounted on an upper surface (front surface) of the wiring board so as to make its functional surface (major surface) face the upper surface, and a resin part which is adhered to a side surfaces of the piezoelectric element and to the wiring board and seals a facing space between the upper surface of the wiring board and the functional surface of the piezoelectric element. Further, the resin part is recessed in shape relative to the facing space.

14 Claims, 8 Drawing Sheets

(51) Int. Cl.
  *H03H 9/10* (2006.01)
  *H05K 3/28* (2006.01)
  *H01L 23/31* (2006.01)
  *H05K 1/02* (2006.01)

(52) U.S. Cl.
  CPC .. *H01L 23/3121* (2013.01); *H01L 2224/16225* (2013.01); *H05K 1/0271* (2013.01); *H05K 2201/10068* (2013.01)

(56) References Cited

U.S. PATENT DOCUMENTS

| | | | | |
|---|---|---|---|---|
| 7,336,017 | B2* | 2/2008 | Lee | H01L 24/97 310/313 R |
| 2002/0140108 | A1* | 10/2002 | Johnson | H01L 21/563 257/778 |
| 2003/0112986 | A1* | 6/2003 | Furukawa | H03H 3/08 381/190 |
| 2004/0251777 | A1* | 12/2004 | Yamamoto | H03H 9/059 310/313 R |
| 2006/0202780 | A1 | 9/2006 | Takamine | |

FOREIGN PATENT DOCUMENTS

| | | |
|---|---|---|
| JP | 2004-039945 A | 2/2004 |
| JP | 2004-215218 A | 7/2004 |
| JP | 2007-073554 A | 3/2007 |
| JP | 2008-041857 A | 2/2008 |
| WO | 2005-099090 A | 10/2005 |

OTHER PUBLICATIONS

International Search Report dated Nov. 27, 2012, issued for International Application No. PCT/JP2012/073470.

* cited by examiner

ELECTRONIC DEVICE

TECHNICAL FIELD

The present invention relates to an electronic device which has an electronic component such as a piezoelectric element mounted therein.

BACKGROUND ART

Known in the art is an electronic device which has a circuit board, an electronic component mounted on the circuit board, and a resin which cover and seals the electronic component. For example, Patent Literature 1 discloses an electronic device which has a surface acoustic wave (SAW) device as the electronic component. In the electronic device, the SAW device is mounted so that its functional surface faces the surface of the circuit board across a predetermined interval therebetween. The facing space between the functional surface of the SAW device and the circuit board is sealed by a sheet and a sealing material (resin) which cover the surface acoustic wave device. An inner wall surface of the sheet and the sealing material which surrounds the facing space is formed in a bulging state.

CITATIONS LIST

Patent Literature

Patent Literature 1: Japanese Patent Publication No. 2000-4139A

SUMMARY OF INVENTION

Technical Problem

A drop in the sealing performance of the facing space sometimes causes a drop in function of the electronic component. On the other hand, if simply making the sealing material thicker or the like, an increase in size of the electronic device is caused. Further, the sealing material exerts an influence upon a deformation of the electronic component due to a thermal expansion or the like. In this way, the sealing material is important for maintaining the function of the electronic component, therefore it has been demanded to more suitably seal the electronic component.

Solution to Problem

An electronic device according to one aspect of the present invention has a circuit board, an electronic component which is mounted on a front surface of the circuit board so as to make its major surface face the front surface, and a resin which is adhered to side surfaces of the electronic component and to the wiring board and seals a facing space between the front surface of the wiring board and the major surface of the electronic component, wherein the resin is recessed in shape relative to the facing space.

Advantageous Effects of Invention

According to the above configuration, the electronic component can be suitably sealed.

DESCRIPTION OF EMBODIMENTS

Figure 1A:
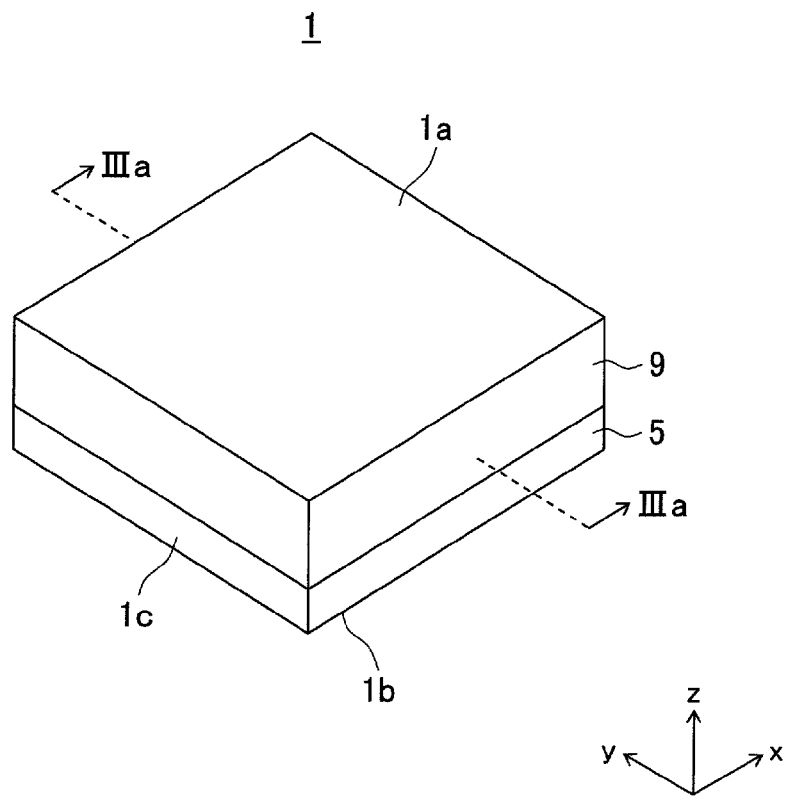
FIG. 1A and FIG. 1B are perspective views showing an appearance of an electronic device according to a first embodiment of the present invention viewed from an upper surface side and a lower surface side.

Below, electronic devices according to embodiments of the present invention will be explained with reference to the drawings. Note that, the drawings used in the following explanation are schematic ones. Dimensions, ratios, etc. in the drawings do not necessarily match with the actual ones.

Further, in the explanation of the embodiments etc., regarding the configuration the same as or similar to the already explained configurations, sometimes the same notations will be attached and the explanations will be omitted.

First Embodiment

Figure 1B:
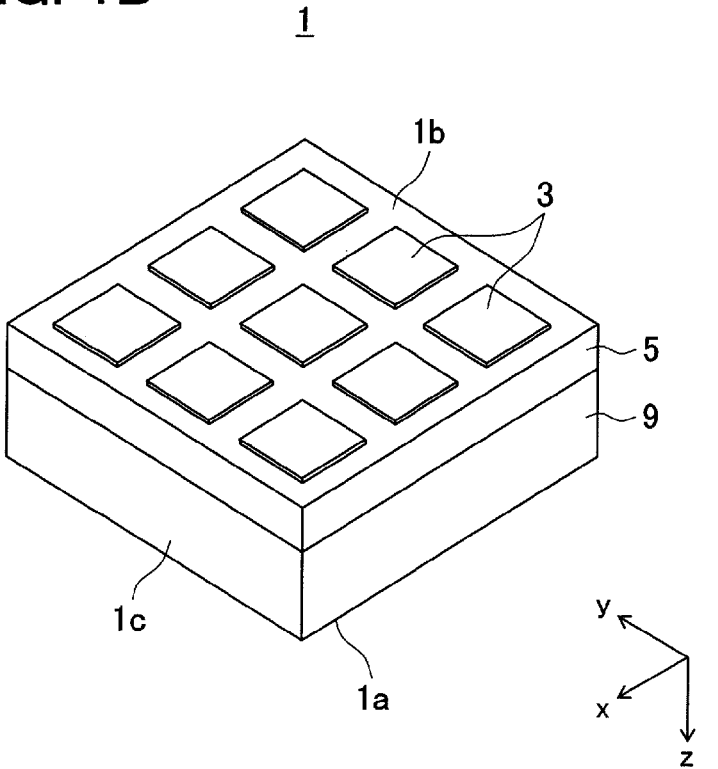

FIG. 1A is a perspective view which shows an appearance of an electronic device 1 according to a first embodiment of the present invention viewed from an upper surface side, and FIG. 1B is a perspective view which shows the appearance of the electronic device 1 viewed from a lower surface side.

Note that, in the electronic device 1, any direction may be defined as upward or downward. However, for convenience, an orthogonal coordinate system xyz is defined, and use is made of terms of "upper surface", "lower surface", etc. where the positive side of the z-direction is the upper part.

The electronic device 1 is for example formed roughly in a box shape and has a plurality of external terminals 3 exposed at its lower surface in suitable shapes and a suitable number. The size of the electronic device 1 may be made a suitable size. However, for example the length of one side is 1 mm to several mm.

The electronic device 1 is arranged with its lower surface made to face a not shown mounting board. It is mounted on the mounting board by joining the pads which are provided on the mounting board and the plurality of external terminals 3 through bumps or the like. Then, the electronic device 1 for example receives signals as input through any of the plurality of external terminals 3, applies predetermined processing to the input signals, and outputs the results from any of the plurality of external terminals 3.

Figure 2:
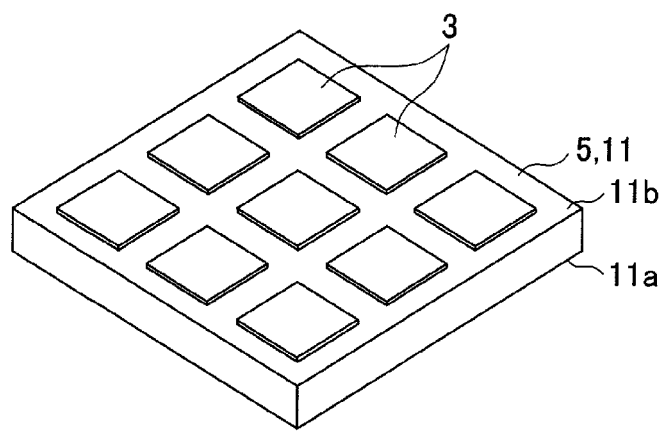
FIG. 2 is a disassembled perspective view of the electronic device in FIG. 1.
Figure 2:
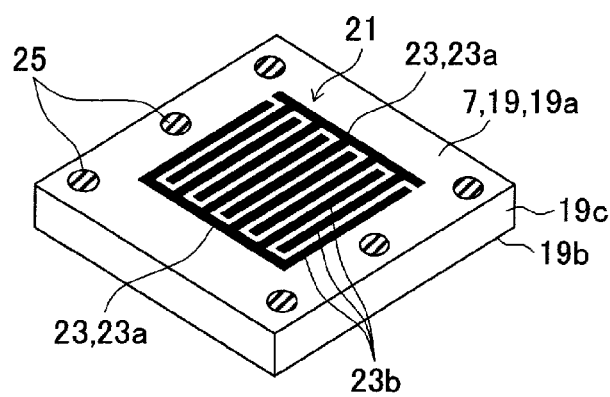
Figure 2:
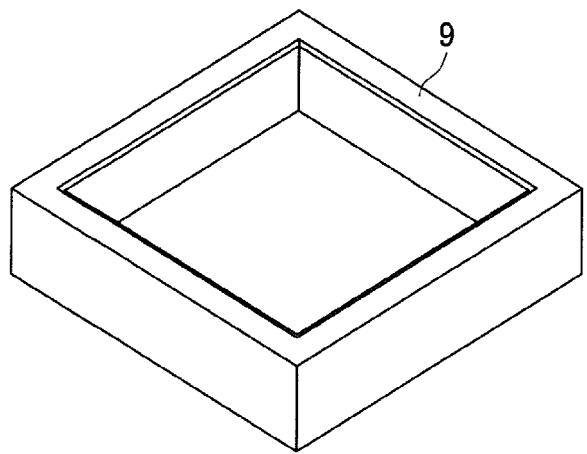
Figure 2:
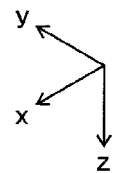
Figure 3A:
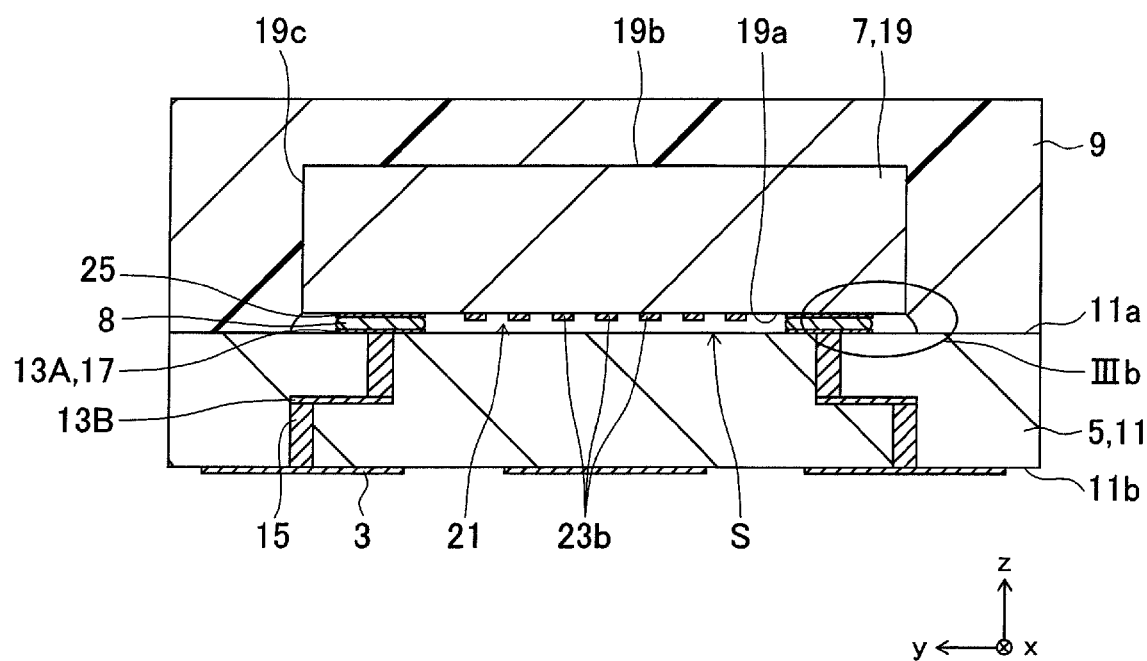
FIG. 3A is a cross-sectional view taken along a line IIIa-IIIa in FIG. 1A.

FIG. 2 is a disassembled perspective view of the electronic device 1. FIG. 3A is a cross-sectional view taken along a line IIIa-IIIa in FIG. 1A.

The electronic device 1 has a wiring board 5, a piezoelectric element 7 which is mounted on the wiring board 5, bumps 8 (FIG. 3A) which are interposed between the wiring board 5 and the piezoelectric element 7, and a resin part 9 for sealing the piezoelectric element 7.

The wiring board 5 is configured by for example a rigid type printed wiring board and has an insulating base body 11, an upper surface conductive layer 13A (FIG. 3A) which formed on an upper surface 11a of the insulating base body 11, an internal conductive layer 13B (FIG. 3A) which is formed inside the insulating base body 11 so as to be parallel to the upper surface 11a, via conductors 15 (FIG. 3A) which penetrate through all or a portion of the insulating base body 11 in an up-down direction, and the already explained external terminals 3 which are formed on a lower surface 11b of the insulating base body 11. Note that, the wiring board 5 may be one without the internal conductive layer 13B formed therein as well.

The insulating base body 11 is for example formed in a roughly thin box shape. Further, the insulating base body 11 is for example formed by containing a resin, a ceramic and/or amorphous state inorganic material. The insulating base body 11 may be one made of a single material or may be one made of a composite material such as a substrate comprised of a base material in which a resin is impregnated.

The upper surface conductive layer 13A includes substrate pads 17 (FIG. 3A) for mounting the piezoelectric element 7 on the wiring board 5. The via conductors 15 and internal conductive layer 13B include interconnects for connecting the substrate pads 17 and the external terminals 3. Note that, the upper surface conductive layer 13A, internal conductive layer 13B, and via conductors 15 may include inductors, capacitors or circuits for running suitable processing as well. The upper surface conductive layer 13A, internal conductive layer 13B, via conductors 15, and external terminals 3 are configured by for example metal such as copper.

The piezoelectric element 7 is for example a SAW element and has a piezoelectric substrate 19, an excitation electrode 21 which is provided on a functional surface 19a of the piezoelectric substrate 19, and element pads 25 which are provided on the functional surface 19a and are connected to the wiring board 5. Note that, the piezoelectric element 7, other than this, may have a protective layer covering the excitation electrode 21, an electrode and/or a protective layer for covering an upper surface 19b of the piezoelectric substrate 19, and other suitable members.

The piezoelectric substrate 19 is for example formed in a roughly thin box shape. The size of the piezoelectric substrate 19 when viewed by a plane view is smaller than the size of the wiring board 5 when viewed by a plane view. The piezoelectric substrate 19 is configured by for example a single crystal substrate which has piezoelectricity such as a lithium tantalate single crystal or a lithium niobate single crystal.

The excitation electrode 21 is a so-called IDT (InterDigital Transducer) and includes a pair of comb-shaped electrodes 13 (FIG. 2). Each comb-shaped electrode 23 has a bus bar 23a (FIG. 2) and a plurality of electrode fingers 23b which extend from the bus bar 23a. The pair of comb-shaped electrodes 23 is arranged so as to mesh with each other (so that the plurality of electrode fingers 23 intersect with each other). Note that, FIG. 2 etc. are schematic diagrams, therefore only one pair of comb-shaped electrodes 23 each having several electrode fingers 23b are shown. In actuality, however, two or more pairs of comb-shaped electrodes 23 each having a larger number of electrode fingers 23b may be provided. The excitation electrode 21 configures for example a SAW filter, SAW resonator and/or duplexer.

When a signal is input to the excitation electrode 21, the signal is converted to a SAW to be propagated through the functional surface 19a in a direction perpendicular to the electrode fingers 23b (y-direction) where it is converted to a signal again which is then output from the excitation electrode 21. In the process, the signal is filtered or the like.

The element pads 25 are connected to the excitation electrode 21 through not shown interconnects formed on the functional surface 19a. The excitation electrode 21 receives as input a signal through any of the plurality of element pads 25 and outputs the signal through any of the plurality of element pads 25.

Note that, the excitation electrode 21, element pads 25, and not shown interconnects for connecting them are configured by for example a suitable metal such as an Al—Cu alloy. These may be formed by the same material or may be formed by materials which are different from each other.

The bumps 8 are interposed between the element pads 25 and the substrate pads 17 and joins these pads. The bumps 8 are configured by solder. The solder may be a solder using lead such as a Pb—Sn alloy solder or may be a lead-free solder such as an Au—Sn alloy solder, Au—Ge alloy solder, Sn—Ag alloy solder, or Sn—Cu alloy solder. Note that, the bumps 8 may be formed by a conductive binder as well.

Due to the bumps 8 being interposed between the element pads 25 and the substrate pads 17, a clearance (facing space S) is formed between the upper surface 11a of the insulating base body 11 and the functional surface 19a of the piezoelectric substrate 19. Due to this, vibration of the functional surface 19a (propagation of SAW) is facilitated.

The resin part 9 is for example provided on the wiring board 5 so as to cover the piezoelectric element 7. That is, the resin part 9 abuts against the upper surface 19b and side surfaces 19c of the piezoelectric element 7 and against the outer peripheral portion of the piezoelectric element 7 at the upper surface 11a of the wiring board 5. At least a portion, preferably all, of these abutting portions is adhered.

The resin part 9 is for example formed so as to exhibit a roughly box shape. The shape and size of that when viewed by a plane view are for example the same as the planar shape of the wiring board 5, and the side surfaces of the resin part 9 are flush with the side surfaces of the wiring board 5. The thickness of the resin part 9 on the piezoelectric element 7 may be a suitable one from the viewpoint of protection of the piezoelectric element 7 and other various viewpoints.

The resin part 9 is configured by a resin. The resin is for example an epoxy resin, a polyimide resin, or a cyano resin. The resin is preferably a thermosetting resin, and the thermosetting resin is for example an epoxy resin or a phenol resin. In the resin, a filler made of insulating particles formed by a material having a lower thermal expansion coefficient than that of this resin may be mixed in. The material of the insulating particles is for example a silica, an alumina, a phenol, a polyethylene, a glass fiber, or a graphite filler.

Note that, since the resin part 9 is formed by a resin, in general, it has a smaller Young's modulus and a larger thermal expansion coefficient compared with the piezoelectric substrate 19 which is comprised of a piezoelectric material. Further, compared with the insulating base body 11, the resin part 9 may have a Young's modulus or thermal expansion coefficient which is larger, equal, or smaller as well. Preferably, the thermal expansion coefficient of the resin part 9 is equal to that of the insulating base body 11.

The resin part 9 is not filled in the facing space S. Gas such as air is filled in the facing space S. The pressure in the facing space S may be higher, equal, or lower relative to atmospheric pressure when the temperature in that facing space S is equal to the temperature of the atmosphere.

Figure 3B:
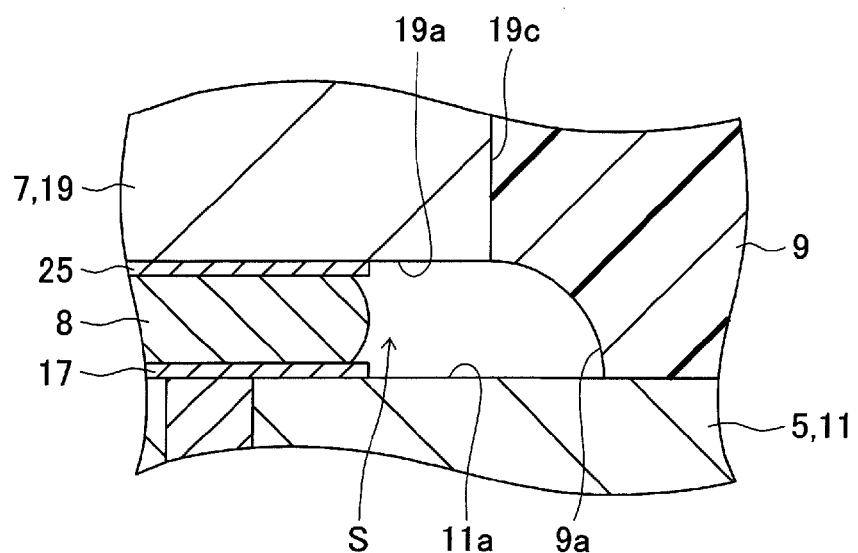
FIG. 3B is an enlarged view of a region 111b in FIG. 3A.

FIG. 3B is an enlarged view of a region 111b in FIG. 3A.

The resin part 9 has an inner wall surface 9a which surrounds the facing space S. The inner wall surface 9a is recessed in shape relative to the facing space S. More specifically, for example, the inner wall surface 9a has an upper end which is positioned at the corner portion which is formed by the functional surface 19a and the side surface 19c of the piezoelectric substrate 19, has a lower end which is positioned further at the outer side than the piezoelectric substrate 19 on the upper surface 11a of the insulating base body 11, and gradually expands from the upper end toward the lower end. Further, line from the upper end to the lower end roughly forms an arc shape.

Figure 4A:
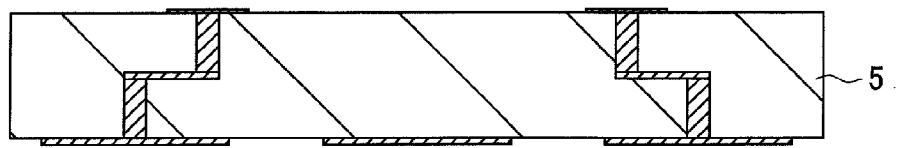
FIG. 4A to FIG. 4D are cross-sectional views for explaining a method of production of the electronic device in FIG. 1.
Figure 4B:
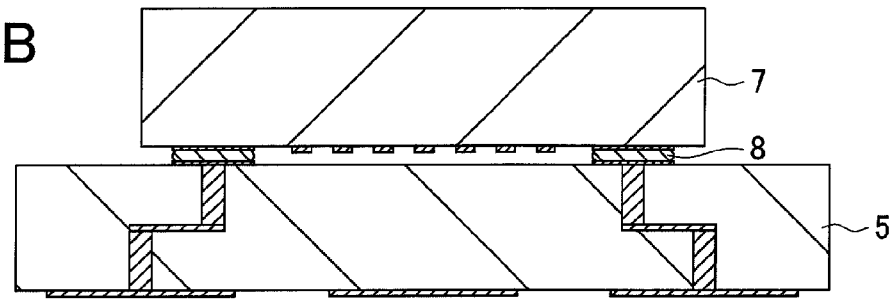
Figure 4C:
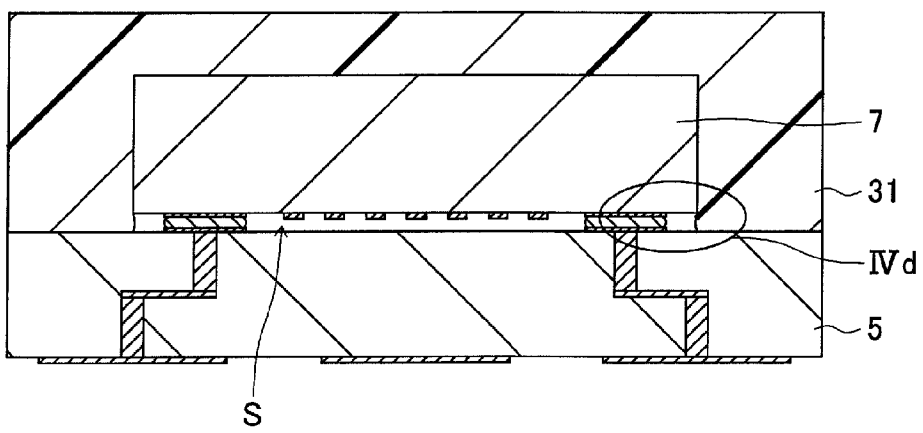
Figure 4D:
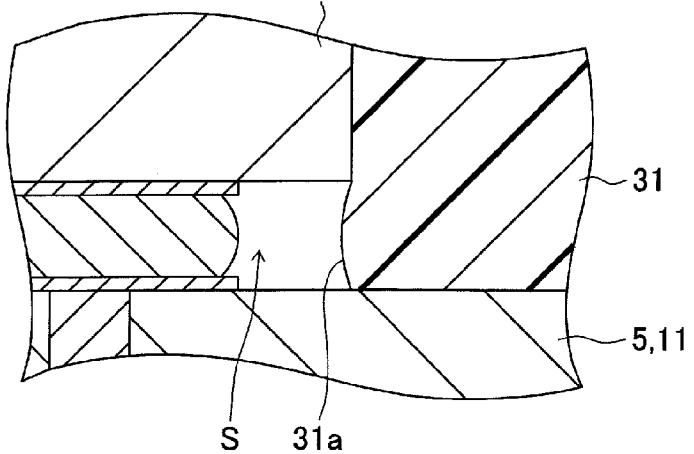

FIG. 4A to FIG. 4D are cross-sectional views for explaining a method of production of the electronic device 1. FIG. 4A to FIG. 4C are cross-sectional views which correspond to FIG. 3A, while FIG. 4D is a cross-sectional view which corresponds to FIG. 3B (enlarged view of region IVd in FIG. 4C).

First, as shown in FIG. 4A, a wiring board 5 is prepared. The wiring board 5 may be prepared in the same way as a general multilayer board.

Next, as shown in FIG. 4B, bumps 8 are formed on the wiring board 5 (or piezoelectric element 7), then the piezoelectric element 7 is mounted on the wiring board 5. The bumps 8 also may be formed in the same way as general bumps. For example, they are formed by a vapor deposition process, plating process, or printing process. Adhering of the wiring board 5 and the piezoelectric element 7 through the bumps 8 may be carried out in the same way as general mounting, for example, by reflow.

Next, as shown in FIG. 4C, a liquid-state material 31 (for example uncured-state resin material) which becomes the resin part 9 is supplied onto the wiring board 5 and piezoelectric element 7. The material 31 is supplied by for example a printing process or dispenser method. Note that, in the supply of the material 31, to prevent the material 31 from flowing into the facing space S, use is made of a material having a relatively high viscosity as the material 31 or the pressure of the material 31 is adjusted (for example the speed of the squeegee in the screen printing is adjusted).

Here, in the material 31, as shown in FIG. 4D, an inner wall surface 31a which surrounds the facing space S is not always recessed in shape. Although depending in part on various conditions such as the viscosity of the material 31, the wettability of the piezoelectric substrate 19 and insulating base body 11, or the pressure which is given to the material 31, for example, the inner wall surface 31a bulges out in shape relative to the facing space S due to the action of the surface tension of the material 31 that trying to make the material 31 approximate a sphere against the expansion of the material 31.

Next, although not particularly shown, the material 31 is pressurized while heating it and the material 31 is made to cure. The pressure in the facing space S becomes high due to pressure and heating (thermal expansion). As a result, the inner wall surface 31a of the material 31 becomes recessed in shape relative to the facing space S due to the action of the surface tension of the material 31 that trying to make the facing space S approximate a sphere against the expansion of the facing space S. Further, if the amount of pressure increase due to heating (thermal expansion) exceeds the amount of pressure increase due to pressurization, the inner wall surface 31a moves further to the outer side than the position shown in FIG. 4D so that the amount of pressure increase due to heating and the amount of pressure increase due to pressurization become balanced. And/or the inner wall surface 31a moves to the outside by shrinkage along with curing of the material 31.

As a result, as shown in FIG. 3B, the inner wall surface 9a of the resin part 9 which is formed by curing of the material 31 becomes recessed in shape relative to the facing space S. Further, the inner wall surface 9a is apt to be positioned further at outer side than the side surface 19c of the piezoelectric substrate 19.

Note that, in the above steps, all or the steps up to the middle may be carried out on a mother board from which multiple wiring boards 5 will be taken or all or the steps from the middle may be carried out for a wiring board 5 after dicing.

As described above, in the present embodiment, the electronic device 1 is provided with the wiring board 5, the piezoelectric element 7 (electronic component) which is mounted on the upper surface 11a (front surface) of the wiring board 5 so as to make its functional surface 19a (major surface) face the upper surface 11a, and the resin part 9 which is adhered to the side surfaces 19c of the piezoelectric element 7 and to the wiring board 5 and seals the facing space S between the upper surface 11a of the wiring board 5 and the functional surface 19a of the piezoelectric element 7. Further, the resin part 9 is recessed in shape relative to the facing space S.

As a result, the piezoelectric element 7 can be suitably sealed. Specifically, it exerts the mode of operation and effects which will be exemplified below.

Figure 5A:
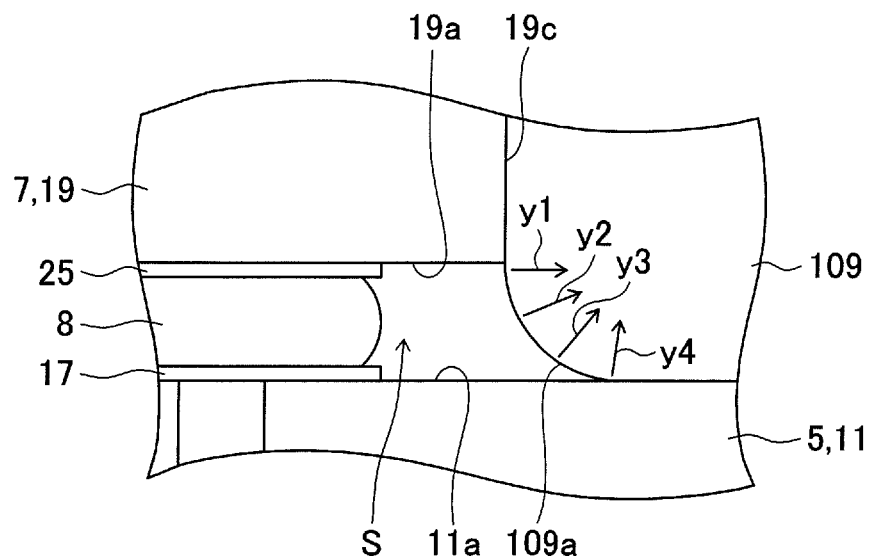
FIG. 5A and FIG. 5B are views for explaining an example of the mode of operation of the electronic device in FIG. 1.
Figure 5B:
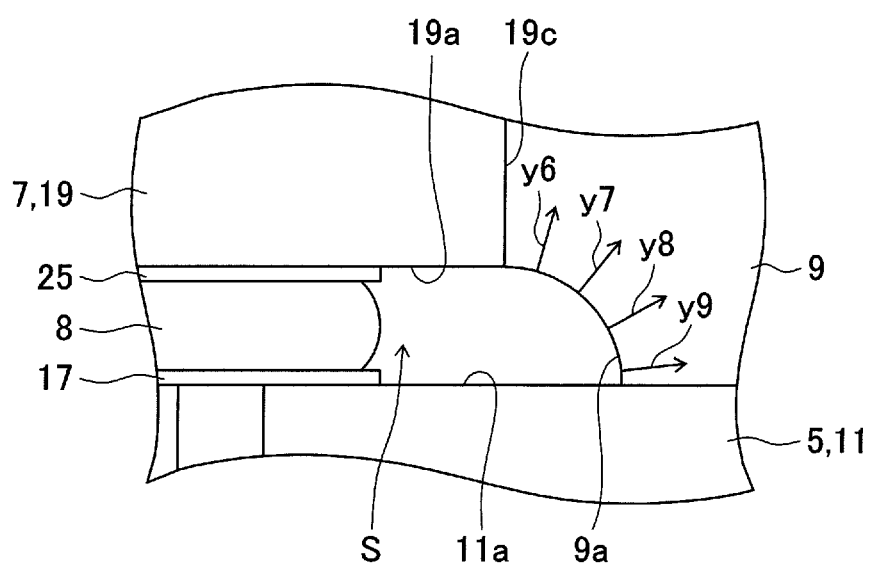

FIG. 5A and FIG. 5B are views for explaining an example of the mode of operation of the present embodiment. FIG. 5A is a cross-sectional view according to a comparative example and corresponds to FIG. 3B, and FIG. 5B is a cross-sectional view according to the present embodiment and corresponds to FIG. 3B. Note, to facilitate viewing of the arrows for explaining the mode of operation, hatching is omitted.

In the comparative example which is shown in FIG. 5A, an inner wall surface 109a of a resin part 109 bulges out in shape relative to the facing space S. Note that, such the inner wall surface 109a is formed without performing the pressurizing and heating step in the present embodiment (step of raising the air pressure in the facing space S).

The pressure of the gas in the facing space S acts in directions which are perpendicular to the inner wall surface 109a. Therefore, at different positions on the inner wall surface 109a, the pressure acts in the directions indicated by the arrow y1 to y4. Specifically, because the inner wall surface 109a bulges out in shape, near the side surface 19c of the piezoelectric element 7, as indicated by the arrow y1, the pressure of the gas acts in a direction which causes the resin part 109 to peel off from the side surface 19c. Further, near the upper surface 11a of the wiring board 5, as indicated by the arrow y4, the pressure of the gas acts in a direction that causes the resin part 109 to peel off from the upper surface 11a. Further, because the inner wall surface 109a bulges out in shape, the shape which is formed by the inner wall surface 109a and the upper surface 11a (or side surface 19c) is a cut-in shape, that is a shape where stress by said pressure in a peel-off direction concentrates.

Accordingly, for example, when the electronic device is exposed to a high temperature (for example, a reflow temperature 200° C. to 300° C.), if the air pressure in the facing space S exceeds the atmospheric pressure (when assuming that a gas having a mass large enough to cause such a state is sealed in the facing space S), peeling-off of the resin part 9 is caused due to the pressure in the facing space S, therefore the sealing performance in the facing space S is liable to be impaired.

On the other hand, in the present embodiment shown in FIG. 5B, the pressure of the gas in the facing space S acts upon the inner wall surface 9a in the directions indicated by the arrows y6 to y9. Specifically, because the inner wall surface 9a is recessed in shape, near the side surface 19c of the piezoelectric element 7, as indicated by the arrow y6, the pressure of the gas acts in a direction that inclines more than the arrow y1 in the comparative example with respect to the direction peeling off the resin part 9 from the side surface 19c. Further, near the upper surface 11a of the wiring board 5, as indicated by the arrow y9, the pressure of the gas acts in a direction which inclines more than the arrow y4 in the comparative example with respect to the direction peeling off the resin part 9 from the upper surface 11a. Further, because the inner wall surface 9a is recessed in shape, the shape which is formed by the inner wall surface 9a and the upper surface 11a (or side surface 19c) becomes a shape where the cut-in angle is gentler than that in the comparative example, that is, a shape where concentration of stress due to the pressure in the peel-off direction is harder to occur than the comparative example.

Accordingly, in the present embodiment, compared with the comparative example, the liability of the sealing performance in the facing space S becoming impaired due to peel-off of the resin part by the air pressure in the facing space S is reduced. From another viewpoint, in the embodiment, the pressure (mass) in the facing space S can be made larger than that in the comparative example. As a result, for example, the condition of the atmosphere in the manufacturing process is eased.

Figure 6:
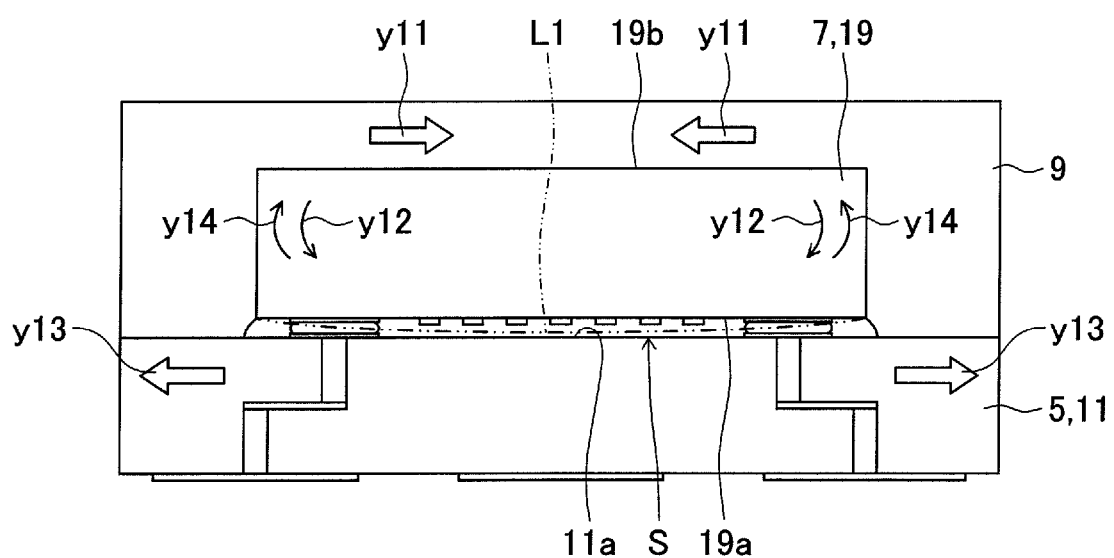
FIG. 6 is a view for explaining another mode of operation of the electronic device in FIG. 1.

FIG. 6 is a cross-sectional view for explaining another mode of operation of the present embodiment and corresponds to FIG. 3A. Note, to facilitate viewing of the arrows for explaining the mode of operation, hatching is omitted.

In the electronic device 1, due to various factors, a bending moment which causes the functional surface 19a to bend is generated. As a result, a change of the propagation characteristics of the SAW may occur. In the present embodiment, however, as explained with reference to FIG. 5, compared with the comparative example, the degree of freedom of the pressure in the facing space S is higher. Therefore, it is expected that the air pressure in the facing space S can be adjusted to suppress such bending.

For example, when thermal expansion is caused in the wiring board 5 as indicated by the arrows y13 or setting shrinkage of the resin part 9 is caused as indicated by the arrows y11, a bending moment as indicated by the arrows y14 is applied to the piezoelectric element 7, so the functional surface 19a may bend as indicated by a two-dot chain line L1. However, by making the air pressure in the facing space S a certain extent of magnitude, bending of the functional surface 19a is suppressed (moment as indicated by arrows y12 which counters moment indicated by the arrows y14 is caused).

(First to Third Modifications)

Figure 7A:
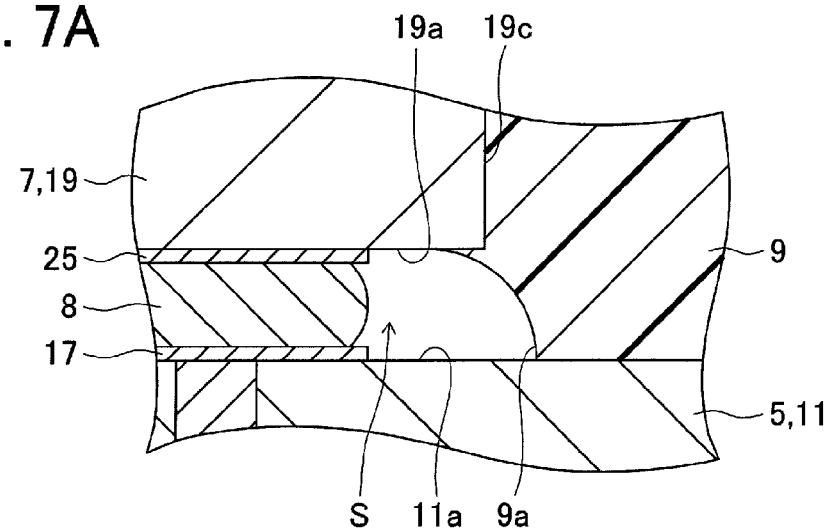
FIG. 7A to FIG. 7C are cross-sectional views which show first to third modifications.
Figure 7B:
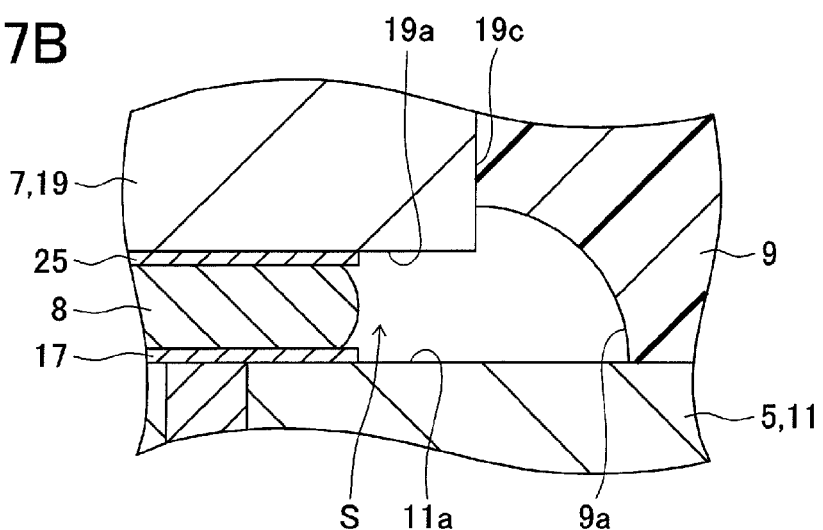
Figure 7C:
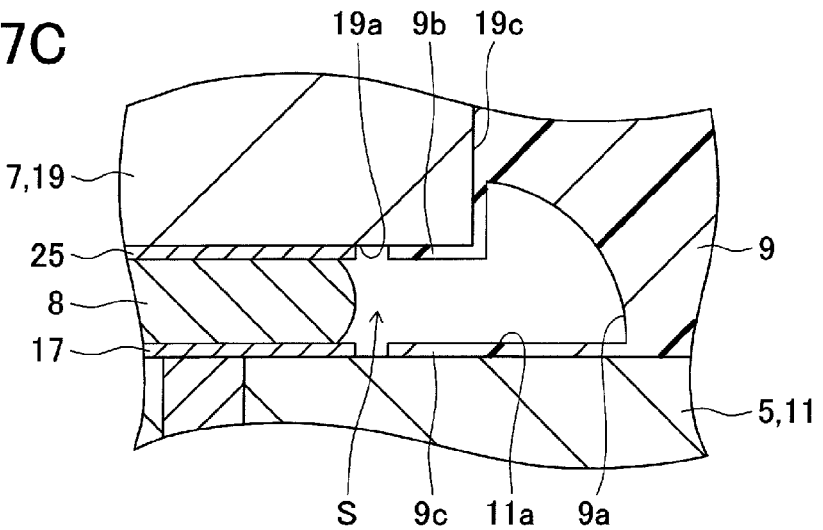

FIG. 7A to FIG. 7C are cross-sectional views according to the first to third modifications and correspond to FIG. 3B.

The first to third modifications differ from the first embodiment only in the shapes, sizes, and/or positions of the portions of the resin parts 9 which contact the facing spaces S. Specifically, this is as follows.

(First Modification)

In the first modification which is shown in FIG. 7A, the inner wall surface 9a is positioned closer to the facing space S side than in the first embodiment. Specifically, the upper end of the inner wall surface 9a is positioned closer to the facing space S side than the corner portion which is formed by the side surface 19c and the functional surface 19a of the piezoelectric substrate 19. The lower end of the inner wall surface 9a is positioned further at the outer side than the side surface 19c in the same way as the first embodiment. However, the lower end of the inner wall surface 9a may also be positioned closer to the facing space S side than the side surface 19c.

Such an inner wall surface 9a is realized by, for example, compared with the first embodiment, adjusting the viscosity or supply rate of the material 31 which becomes the resin part 9, making the pressure to be added at the time of curing the material 31 larger, and/or making the temperature at the time of curing the material 31 lower.

According to the first modification as well, the same effects as those by the first embodiment are exhibited. Further, since the resin part 9 engages with the functional surface 19a of the piezoelectric substrate 19, the effect of suppression of peel-off of the resin part 9 from the piezoelectric substrate 19 is improved.

(Second Modification)

In the second modification which is shown in FIG. 7B, conversely to the first modification, the inner wall surface 9a is positioned at the side opposite to the facing space S further than that in the first embodiment. Specifically, the upper end of the inner wall surface 9a is positioned higher than the corner portion which formed by the side surface 19c and the functional surface 19a of the piezoelectric substrate 19. From another viewpoint, the upper end of the inner wall surface 9a (recessed in shape) is positioned at the side surface 19c of the piezoelectric substrate 7. Note that, the lower end of the inner wall surface 9a is positioned further at the outer side than the side surface 19c in the same way as the first embodiment.

Such an inner wall surface 9a is realized by, for example, compared with the first embodiment, adjusting the viscosity or supply rate of the material 31 which becomes the resin part 9, making the pressure to be added at the time of curing the material 31 smaller, and/or making the temperature at the time of curing the material 31 higher.

According to the second modification as well, the same effects as those by the first embodiment are exhibited. Further, since the action of the shrinkage force or tensile force of the resin part 9 due to the thermal expansion or drop impact etc. upon the vicinity of the functional surface 19a of the piezoelectric substrate 19 is suppressed, improvement of electrical reliability etc. of the electronic device 1 can be expected.

(Third Modification)

In the third modification which is shown in FIG. 7C, in the same way as the second modification, the inner wall surface 9a (recessed portion) is positioned at the side opposite to the facing space S further than that in the first embodiment. That is, the upper end of the inner wall surface 9a (recessed portion) is positioned higher than the corner portion which is formed by the side surface 19c and the functional surface 19a of the piezoelectric substrate 19, while the lower end of the inner wall surface 9a is positioned further at outer side than the side surface 19c.

Note, the resin part 9 has a first film portion 9b which covers the peripheral part of the functional surface 19a of the piezoelectric substrate 19 and a second film portion 9c which covers the portion of the upper surface 11a of the wiring board 5 which faces the peripheral part of the functional surface 19a. These first film portion 9b and second film portion 9c are smaller in thickness than the height of the facing space S.

Such an inner wall surface 9a is for example formed as follows: First, at the time of supply of the material 31 of the resin part 9, the viscosity and supply rate of the material 31 are adjusted so as to make the material 31 intrude closer to the facing space S side than the side surface 19c. That is, the material 31 is deposited on the functional surface 19a and upper surface 11a on the side closer to the facing space S than the side surface 19c. After that, at the time of curing, the pressurizing pressure and heating temperature are adjusted so that the gas in the facing space S expands over the side surface 19c. Due to this, in the material 31, portions which become the first film portion 9b and second film portion 9c remain on the functional surface 19a and upper surface 11a. Further, the inner wall surface 9a becomes a size whereby its upper side portion is positioned at the side surface 19c.

Note that, while having the first film portion 9b and the second film portion 9c, the size of the inner wall surface 9a may be made the same as that in the first embodiment or first modification. Further, by suitably setting the wettability etc. of the functional surface 19a and upper surface 11a, just one of the first film portion 9b and the second film portion 9c may be provided. Note that, according to the wettability etc. of the functional surface 19a and the upper surface 11a, in the same way as the third modification, it is also possible to make the material 31 intrude closer to the facing space S side than the side surface 19c and then form the resin part 9 in the first embodiment or the second modification.

According to the third modification as well, the same effects as those by the first embodiment are exhibited. Further, in the third modification, the peripheral part of the functional surface 19a of the piezoelectric element 7 is covered by the resin part 9 (first film portion 9b) to a thickness less than the thickness of the facing space S, therefore the first film section 9b becomes a holding part, so the effect of suppression of peel-off of the resin part 9 from the piezoelectric element 7 is improved. In addition, compared with the case where the resin part 9 is filled between the periphery of the functional surface 19a and the wiring board 5, local action of the thermal stress of the resin part 9 (in other words, pressure having a magnitude which is different from that of the pressure of the gas in the facing space S acting upon the most part of the functional surface 19a) upon the functional surface 19a is suppressed and consequently suppression of bending of the functional surface 19a can be expected.

Further, in the third modification, since the portion in the wiring board 5 which faces the periphery of the functional surface 19a is covered by the resin part 9 (second film section 9c) to a thickness less than the thickness of the facing space S, the adhered area of the resin part 9 and upper surface 11a is enlarged, so the effect of suppression of peel-off of the resin part 9 from the wiring board 5 is improved. In addition, in the same way as the first film portion 9b, compared with the case where the resin part 9 is filled between the periphery of the functional surface 19a and the wiring board 5, local action of the thermal stress of the resin part 9 upon the functional surface 19a is suppressed and consequently suppression of bending of the functional surface 19a can be expected.

Further, in the case where both of the first film portion 9b and second film portion 9c are provided, the force causing peel-off the piezoelectric element 7 from the wiring board 5 due to the pressure of the gas between the periphery of the functional surface 19a and the wiring board 5 is reduced by the resilience of the resin part 9.

Second Embodiment

Figure 8:
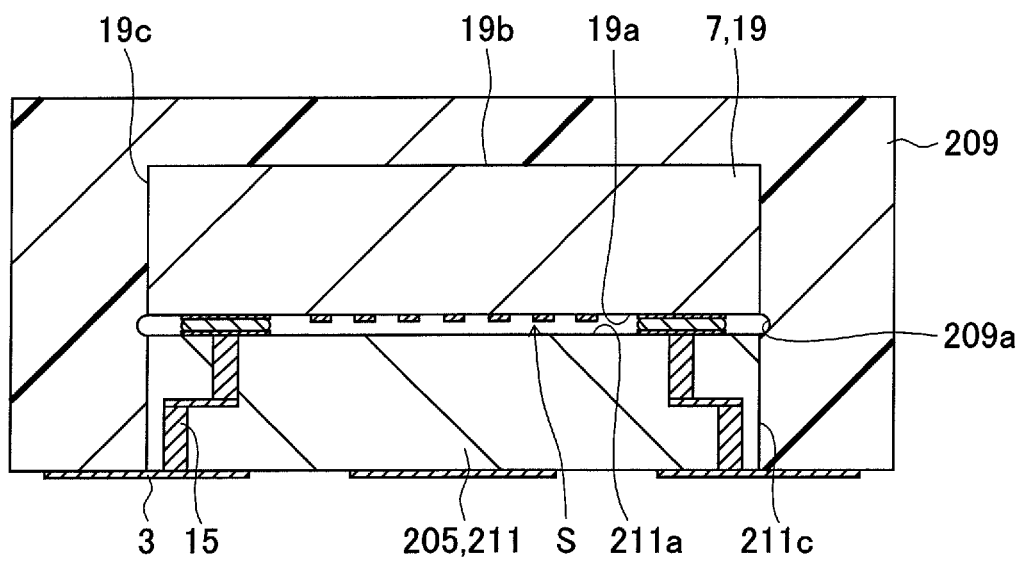
FIG. 8 is a cross-sectional view according to a second embodiment of the present invention.

FIG. 8 is a cross-sectional view which shows an electronic device 201 in a second embodiment and corresponds to FIG. 3A.

In the electronic device 201, a resin part 209 covers side surfaces 211c of an insulating base body 211 of a wiring board 205 as well. Note that the side surface 211c of the wiring board 205 may be positioned at an inner side from the side surface 19c of the piezoelectric substrate 19, may be flush with the side surface 19c, or may be positioned at an outer side from the side surface 19c. FIG. 8 illustrates the case where they are flush surfaces.

Further, in the resin part 209 as well, an inner wall surface 209a which surrounds the facing space S is recessed in shape relative to the facing space S. More specifically, it exhibits roughly an arc shape. Note that, in the same way as the first embodiment, the upper end of the inner wall surface 209a is positioned at the corner portion which is formed by the side surface 19c and the functional surface 19a of the piezoelectric substrate 19, while the lower end of the inner wall surface 209a is positioned at the corner portion which is formed by the side surface 211c and the upper surface 211a of the insulating base body 211.

Note that, in the second embodiment as well, in the same way as the first to third modifications, the inner wall surface 209a may be formed so that its upper end is suitably positioned or may be provided with a first film portion 9b. Further, in the inner wall surface 209a, in the same way as the upper end, its lower end may also be positioned closer to the facing space S side or closer to the side surface 211c side than the corner portion which is formed by the side surface 211c and the upper surface 211a or may be provided with a second film portion 9c.

In the electronic device 201, external terminals 3 are provided not only on the insulating base body 211 of the wiring board 205, but also on the resin part 209. The external terminal 3 which is formed on the resin part 209 may be formed on the resin part 209 as a whole or may be formed straddling the insulating base body 211 and the resin part 209 as shown in FIG. 8. Note that, the external terminal 3 may also be provided on just one of the wiring board 205 and the resin part 209.

The method of production of the electronic device 201 may be made roughly the same as the method of production of the electronic device 1 in the first embodiment. Note, it is necessary to perform dicing of the wiring board 205 before formation of the resin part 209. Further, it is necessary to prepare the external terminals 3 after the formation of the resin part 209 separately from manufacturing of the wiring board 205. Note that, in the method of production of the electronic device 201, before the formation of the resin part 209, it is possible to bond together a mother board from which multiple piezoelectric elements 7 will be taken and a mother board from which multiple wiring boards 205 will be taken and to dice the mother boards after bonding (simultaneously).

As described above, in the second embodiment, in the same way as the first embodiment, the electronic device 201 is provided with a wiring board 205, a piezoelectric element 7 which is mounted on an upper surface 211a of the wiring board 205 so as to make its functional surface 19a face the upper surface 211a, and a resin part 209 which is adhered to the side surfaces 19c of the piezoelectric element 7 and to the wiring board 205 and seals the facing space S between the upper surface 211a of the wiring board 205 and the functional surface 19a of the piezoelectric element 7. The resin part 209 is recessed in shape relative to the facing space S. Accordingly, the same effects as those by the first embodiment are exhibited.

The present invention is not limited to the above embodiments and may be worked in various ways.

The electronic device is not limited to one mounted on a mounting board. In other words, the wiring board is not limited to one which is interposed between an electronic component and a mounting board. For example, the wiring board may also be one which functions as a mother board (main board) of an electronic apparatus such as a mobile phone.

Further, the electronic device is not limited to one which has only one electronic component which is sealed by a resin.

That is, the electronic device may be one which includes one or more other electronic components which are sealed by the resin together with said one electronic component and/or other electronic components which are not sealed by the resin and is formed in a module. Note that, not all of the plurality of electronic components which are sealed by a resin have to configure the facing space. It is sufficient that at least one electronic component configure the facing space.

The electronic component is not limited to a piezoelectric element. For example, the electronic component may be a semiconductor chip, capacitor, inductor, or resistor. Further, the piezoelectric element is not limited to a SAW element. For example, the piezoelectric element may be a film bulk acoustic resonator (FBAR) or may be an elastic boundary wave element (note, included in a SAW element in a broad sense). Note that, from the viewpoint of effective utilization of the facing space, preferably the electronic component is a piezoelectric element.

The specific shape of the recess of the resin is not limited to the one illustrated in the embodiments etc. For example, in the first embodiment, the inner wall surface 9a was positioned so that it gradually expanded from the upper end to the lower end. However, as the inner wall surface 9a, an inner wall surface may be formed which is positioned gradually outward from the upper end toward the center and gradually inward from the center to the lower end. The shape of the recessed inner wall surface can be suitably adjusted by the viscosity of the resin, its density, supply rate, heating temperature or pressure to be added at the time of curing, wettability of the wiring board or electronic component, and so on. The specific shape of the recess may also be one where the mode of operation and effects illustrated in the embodiments are not exhibited.

The resin is not limited to one which has a thermal expansion coefficient (or thermal stress) higher than the thermal expansion coefficient of the electronic component or wiring board. The resin exerts effects such as improvement of the degree of freedom for setting the pressure in the facing space by its recessed shape relative to the facing space even if its thermal expansion coefficient etc. are smaller than those of the electronic component.

The resin part is not limited to one formed by only curing of a liquid-state resin. For example, the resin part may be formed by covering the electronic component by a sheet-shaped resin (or resin having a high viscosity), then supplying a liquid-state resin from above and curing the same.

The resin part need not cover the upper surface of the electronic component. However, if the resin part covers the upper surface of the electronic component, various advantageous effects are obtained.

For example, it becomes easier to attach an index mark to the upper surface (resin) of the electronic device by a laser or the like. Note that, when a laser is directly fired on to the upper surface of the electronic component, the laser is liable to pass through the electronic component. As a result, for example, in a piezoelectric element as an electronic component, the excitation electrode on the lower surface is liable to be damaged. However, by covering the upper surface of the electronic component by a resin, the energy of the laser is absorbed by the resin, therefore such an apprehension can be reduced.

Further, for example, the area of the upper surface of the electronic device is increased due to the resin, therefore pickup of the electronic device by suction is facilitated. Further, for example, the protection of the electronic component is improved.

The electronic device may have a conductive film which covers the resin part. In this case, the shielding property is improved. Note that, from the viewpoint of improving the shield effect, the conductive film is preferably connected to the ground potential. The conductive film is for example formed by vapor deposition or coating of a conductive paste.

REFERENCE SIGNS LIST

1 ... electronic device, 5 ... wiring board, 7 ... piezoelectric element (electronic component), 9 ... resin part (resin), and S ... facing space.

The invention claimed is:

1. An electronic device comprising:
   a wiring board,
   an electronic component which is mounted on a front surface of the wiring board so as to make its major surface face the front surface, and
   a resin which is adhered to a side surface of the electronic component and to the wiring board and seals a facing space between the front surface of the wiring board and the major surface of the electronic component, wherein
   the resin is recessed in shape relative to the facing space,
   wherein an upper end of the recessed shape is positioned higher than a corner portion which is formed by the side surface of the electronic component and the major surface of the electronic component,
   wherein a lower end portion of the side surface of the electronic component, which is lower than the upper end of the recessed shape, and a periphery of the major surface of the electronic component are covered by the resin to a thickness less than the thickness of the facing space, and
   wherein a portion of the resin, which covers the periphery of the major surface of the electronic component to the thickness less than the thickness of the facing space, faces a portion of the front surface of the wiring board, which faces the periphery of the major surface of the electronic component, through gas.

2. The electronic device as set forth in claim 1, wherein the resin covers an upper surface of the electronic component.

3. The electronic device as set forth in claim 1, wherein a lower end of the recessed shape is positioned outside other than the side surface of the electronic component.

4. The electronic device as set forth in claim 3, wherein the portion in the wiring board, which faces the periphery of the major surface of the electronic component, and a surrounding portion in the wiring board, which are positioned inside other than the lower end of the recessed shape, are covered by the resin to a thickness less than the thickness of the facing space.

5. The electronic device as set forth in claim 2, wherein a lower end of the recessed shape is positioned outside other than the side surface of the electronic component.

6. The electronic device as set forth in claim 5, wherein the portion in the wiring board, which faces the periphery of the major surface of the electronic component, and a surrounding portion in the wiring board, which are positioned inside other than the lower end of the recessed shape, are covered by the resin to a thickness less than the thickness of the facing space.

7. An electronic device comprising:
   a wiring board;
   an electronic component which is mounted on a front surface of the wiring board so as to make its major surface face the front surface; and
   a resin which is adhered to a side surface of the electronic component and to the wiring board and seals a facing space between the front surface of the wiring board and the major surface of the electronic component, wherein
   the resin is recessed in shape relative to the facing space,
   wherein a lower end of the recessed shape is positioned outside other than the side surface of the electronic component, wherein a portion in the wiring board, which faces a periphery of the major surface of the electronic component, and a surrounding portion in the wiring board, which are positioned inside other than the lower end of the recessed shape, are covered by the resin to a thickness less than the thickness of the facing space, and wherein a portion of the resin, which covers the portion in the wiring board which faces the periphery of the major surface of the electronic component to the thickness less than the thickness of the facing space, faces the periphery of the major surface of the electronic component through gas.

8. The electronic device as set forth in claim 7, wherein the resin covers an upper surface of the electronic component.

9. The electronic device as set forth in claim 8, wherein an upper end of the recessed shape is positioned higher than a corner portion which is formed by the side surface of the electronic component and the major surface of the electronic component.

10. The electronic device as set forth in claim 9, wherein a lower end portion of the side surface of the electronic component, which is lower than the upper end of the recessed shape, and the periphery of the major surface of the electronic component are covered by the resin to a thickness less than the thickness of the facing space.

11. The electronic device as set forth in claim 8, wherein the periphery of the major surface of the electronic component is covered by the resin to a thickness less than the thickness of the facing space.

12. The electronic device as set forth in claim 7, wherein an upper end of the recessed shape is positioned higher than a corner portion which is formed by the side surface of the electronic component and the major surface of the electronic component.

13. The electronic device as set forth in claim 12, wherein a lower end portion of the side surface of the electronic component which is lower than the upper end of the recessed shape and the periphery of the major surface of the electronic component are covered by the resin to a thickness less than the thickness of the facing space.

14. The electronic device as set forth in claim 7, wherein the periphery of the major surface of the electronic component is covered by the resin to a thickness less than the thickness of the facing space.

* * * * *